United States Patent [19]

Getty

[11] Patent Number: 5,466,295
[45] Date of Patent: Nov. 14, 1995

[54] ECR PLASMA GENERATION APPARATUS AND METHODS

[75] Inventor: Ward D. Getty, Ann Arbor, Mich.

[73] Assignee: Board of Regents Acting for the Univ. of Michigan, Ann Arbor, Mich.

[21] Appl. No.: 142,731

[22] Filed: Oct. 25, 1993

[51] Int. Cl.⁶ .................................................. C23C 16/00
[52] U.S. Cl. .................. 118/723 MA; 118/723 MR; 333/252; 315/111.41; 315/111.71; 315/111.81
[58] Field of Search .................................. 118/723 MW, 118/723 ME, 723 MR, 723 MA; 156/643, 345; 315/111.41, 111.71, 111.81; 333/252

[56] References Cited

U.S. PATENT DOCUMENTS

| | | | |
|---|---|---|---|
| 4,906,898 | 3/1990 | Moisan | 315/39 |
| 4,985,109 | 1/1991 | Otsubo et al. | 156/345 |
| 5,216,329 | 6/1993 | Pelleteir | 315/111 |
| 5,302,803 | 4/1994 | Stevens et al. | 156/345 |
| 5,328,515 | 7/1994 | Chouan et al. | 118/723 ME |

OTHER PUBLICATIONS

Etching and Coating with Innovative ECR–Technology; Leybold AG Brochure (date unknown).

Elongated Microwave Electron Cyclotron Resonance Heating Plasma Source: M. Geisler et al; pp. 908–915; *J.Vac.Sci.Technol.*, vol. 8, No. 2, Mar./Apr. 1990.

Characterization of a New Electron Cyclotron Resonance Source Working with Permanent Magnets; G. Neumann et al, *J.Vac.Sci.Technol. B*, vol. 9, No. 2, Mar./Apr. 1991; pp. 335–338.

Trends in Plasma Sources: The Search Continues; P. Singer, *Semiconductor International*, Jul. 1992, pp. 52–56.

Optimally Stable Electron Cyclotron Resonance Plasma Generation and Essential Points for Compact Plasma Source; Samukawa et al, *Jpn.J.Appl.Phys.* vol. 31 (1992) pp. 4348–4356.

Planar for Plasma Sources; AJA International Brochure (date unknown).

*Primary Examiner*—Olik Chaudhuri
*Assistant Examiner*—Brian K. Dutton
*Attorney, Agent, or Firm*—Gifford, Krass, Groh, Sprinkle, Patmore, Anderson & Citkowski

[57] ABSTRACT

A plurality of magnetized elements form a continuous surface proximate to a waveguide opening, sufficient to satisfy electron cyclotron resonance plasma generation. With the elements similarly magnetized in a direction perpendicular to their central axis and parallel to the plane in which they are situated, a continuous resonance surface may be formed without the need for an externally applied magnetic field. Other magnetization orientations, such as perpendicular to the plane of the elements, may require an external magnetic field, such as that derived from solenoidal coils, but of a magnitude substantially reduced due to the combined field supplied by the elements. The invention may be used with rectangular or circular waveguides with or without a dielectric window, and a magnetizable strip of material may be disposed peripherally around the plane within which magnetized elements rest in order to displace the resonance surface away from the elements, allowing the elements to be disposed outside of the plasma-processing chamber. Ferrite material may be placed in the gaps between the elements to strengthen the overall combined field and the displaced resonance surface.

33 Claims, 9 Drawing Sheets

ECR PLASMA GENERATION APPARATUS AND METHODS

FIELD OF THE INVENTION

This invention relates to electron cyclotron resonance (ECR) plasma generation and, more particularly, to structures and methods which provide an efficient coupling of energy from a waveguide through a continuous resonance surface formed by permanent magnets which further act as a microwave circuit element.

BACKGROUND OF THE INVENTION

Due to the controllable reactivity made possible by ionized gas species, plasma processing has become an important technology associated with various production processes, including surface preparation, etching and deposition, the latter now often called plasma-enhanced chemical-vapor deposition (PECVD). The workpiece upon which these processes are performed is called the substrate.

Plasma sources utilized for such processes operate at both high pressures, generally in excess of 100 Torr and at low pressures, which are, for example, below 100 Torr. Low-pressure plasmas may be operated with direct current (DC) or alternating current (AC) power sources. The AC power sources are generally of the radio-frequency (RF) type, which operate generally at 100 MHz or below, or of the microwave variety, wherein the source operates typically at frequencies in excess of 100 MHz.

Most microwave plasmas in use for the purposes set forth above are called electron-cyclotron-resonance (ECR) plasmas, characterized in that a static magnetic field of sufficient strength results in efficient plasma production under the proper circumstances. The magnitude of the required magnetic flux density B is given by the relation $B=(2\pi mf)/e$ where m and e are the mass and charge of the electron, respectively, and f is the frequency of the energy being carried by the waveguide. Solving with the constants yields $f=0.0028B$, where B is the magnetic flux density in Gauss, and f is the microwave frequency expressed in GHz. Thus, for example, for a frequency of 2.45 GHz, a frequency made popular by a large number of commercially available sources, a magnetic flux density of 875 Gauss is required in order to satisfy the resonance condition for efficient plasma production. (Frequencies of approximately 400 MHz and 915 are also important due to the availability of commercial sources.)

In prior-art devices, the required magnetic field is produced by solenoidal electric coils, permanent magnets, or by some combination of the two. The microwaves are then coupled to the vacuum chamber and the plasma therein by way of either a tunable resonant cavity or through a waveguide window composed of a dielectric material, this window incorporating a vacuum seal to ensure that the vacuum chamber remains isolated from atmospheric pressures and undesirable contaminants. The resonant-cavity approach ordinarily uses permanent magnets commonly arranged in a circle around an evacuated dielectric chamber, obviating the need for solenoidal electric coils in order to satisfy the resonance condition. In this case, the magnetic field strength associated with a particular permanent magnet falls off rapidly as a function of the distance from the magnet, so that most of the plasma is field-free.

The window approach utilizes a waveguide that delivers microwave power up to the window, where it may pass into the vacuum chamber and generate a plasma therein. The advantage of waveguide coupling is that a resonant cavity is not required. As a consequence, the diameters of the plasma and the chamber are not restricted by the need to satisfy resonant-cavity geometrical constraints imposed by the resonant cavity condition. Larger diameter plasmas are, therefore, made possible for a given microwave frequency.

Although waveguide coupling forgoes the requirement of a resonant cavity, and although it is less susceptible to geometrical constraints, currently available systems have drawbacks. The electromagnets present in waveguide-type plasma sources are typically configured to immerse the entire plasma in a magnetic field, requiring a strength ranging from 875 Gauss near the window to a few hundred Gauss near the substrate for a frequency of 2.45 GHz. These electromagnets are bulky and expensive to produce and operate. As a consequence, although waveguide-type microwave plasma sources appear to be among the most versatile and scalable to larger substrates and more demanding applications, there remains a need for a more efficient and elegant means for producing the magnetic field necessary to satisfy the resonance condition.

SUMMARY OF THE INVENTION

The present invention overcomes prior-art limitations by arranging a plurality of magnetized elements in spaced-apart relation to one another across the output of an energy-carrying waveguide in a plane parallel to the waveguide cross section at its output, the elements being magnetized in such a manner that their fields combine to form a substantially continuous resonance surface sufficient to support ECR plasma generation. This surface may be used to generate a plasma useful for various processes, including etching, deposition, sputtering and other surface-oriented operations upon semiconductor substrates and other types of materials.

The magnetized elements in conjunction with the associated metal frame used to hold them also function as a metallic microwave circuit element useful in coupling and power matching of the energy carried by the waveguide. This power matching may be adjusted so that reflected power in the waveguide is minimized or eliminated, resulting in microwave circuit performance that is less sensitive to plasma conditions.

Depending upon the magnetization within the elements, the present invention may be used in conjunction with an externally provided solenoidal magnetic field but with a markedly reduced field-strength requirement as compared to prior-art waveguide-type ECR plasma systems. In the preferred embodiment, however, the magnetization of the elements is such that a continuous resonance surface is formed at the output of the waveguide, in the presence or absence of a dielectric window, without the need for an externally applied field. The apparatus and methods of the present invention are applicable to both circular and rectangular waveguides, though, in some cases, mode conversion may be required to prepare the fields in the waveguide for the least attenuation of the energy as it passes through the magnetized elements and their holder.

In the preferred embodiment, a plurality of elongated magnetized elements are disposed transversely across, and in parallel relation to one another, at the point where the waveguide opens into the volume within which a plasma-related process is to be carried out. All of the elements are similarly magnetized, with their magnetization field preferably being perpendicular to the lengthwise dimension of the elements and also perpendicular to the longitudinal axis of the waveguide at its output opening; that is, parallel to a cross-sectional plane of the waveguide at the point where the energy emerges therefrom.

With the arrangement just described, the fields contributed by the multiple elements combine to form a continuous resonant surface and, on the side of the elements away from the waveguide, presumably in a volume at reduced pressure, this surface results in efficient plasma production in accordance with known ECR principles. The plasma thus developed may then diffuse through a volume between the elements and the surface of a substrate, thereby exposing the substrate to the plasma in order to perform a particular plasma-related operation.

The magnetized elements may either be in the form of bar-shaped permanent magnets or, alternatively, magnetized material may be deposited directly onto a dielectric window or other surface and etched in order to form a plurality of parallel shapes. In the case of permanent bar-type magnets, the magnetic elements may be formed by placing two or more shorter bar magnets end-to-end to form longer magnetized elements. Also in the case of permanent bar-type magnets, a non-magnetizable grill-like structure may advantageously be used as a frame to hold these magnets proximate to the output surface plane of the waveguide. In an alternative embodiment, the basic assembly of the elements may be improved with the addition of strips of magnetizable material on portions of the periphery of the plane defined by the elements, this material acting to displace the resonance surface relative to the plane of the elements so that, in the preferred embodiment of this alternative, the magnets may be placed on the waveguide-side of a dielectric window, thus facilitating more straightforward maintenance while reducing contamination from the elements within the processing environment.

As a further alternative embodiment, ferrite material may be placed within the gaps between the parallel elements, these pieces of ferrite acting to consolidate and strengthen the magnetic field contributed by the magnetized elements, enabling the magnetized elements to be used to form a displaced surface sufficient to satisfy the resonance condition at a distance displaced from the plane of the elements, the ferrite material being of a type that weakly absorbs microwave energy.

The elements need not be magnetized in order to function as a microwave circuit element and, in fact, may be made hollow in order to accommodate the flow of a coolant useful in reducing the temperature of system components, such as the dielectric window. The grill itself when used to hold magnets may also include channels through which a coolant may be flowed. If in this alterative the elements are metallic but not magnetic, no ECR surface would be formed and the required magnetic fields would have to be provided by some other source, such as a solenoidal field. The elements may also be adhered directly to the window, thereby adding strength and allowing a thinner dielectric window to be used.

DETAILED DESCRIPTION OF THE INVENTION

The present invention relates to methods and apparatus associated with coupling microwave energy from a source into a chamber wherein plasma-related processes may be carried out. Specifically, the present invention is directed toward processes carried out in a low-pressure regime, typically below 100 Torr, with the microwave power source operating at a frequency of interest of several 100 MHz and above. More particularly, the invention uses permanent magnets to generate a resonance surface sufficient to satisfy electron cyclotron resonance while, at the same time, improving the flow of microwave energy from a waveguide into a plasma-processing chamber.

Figure 1:
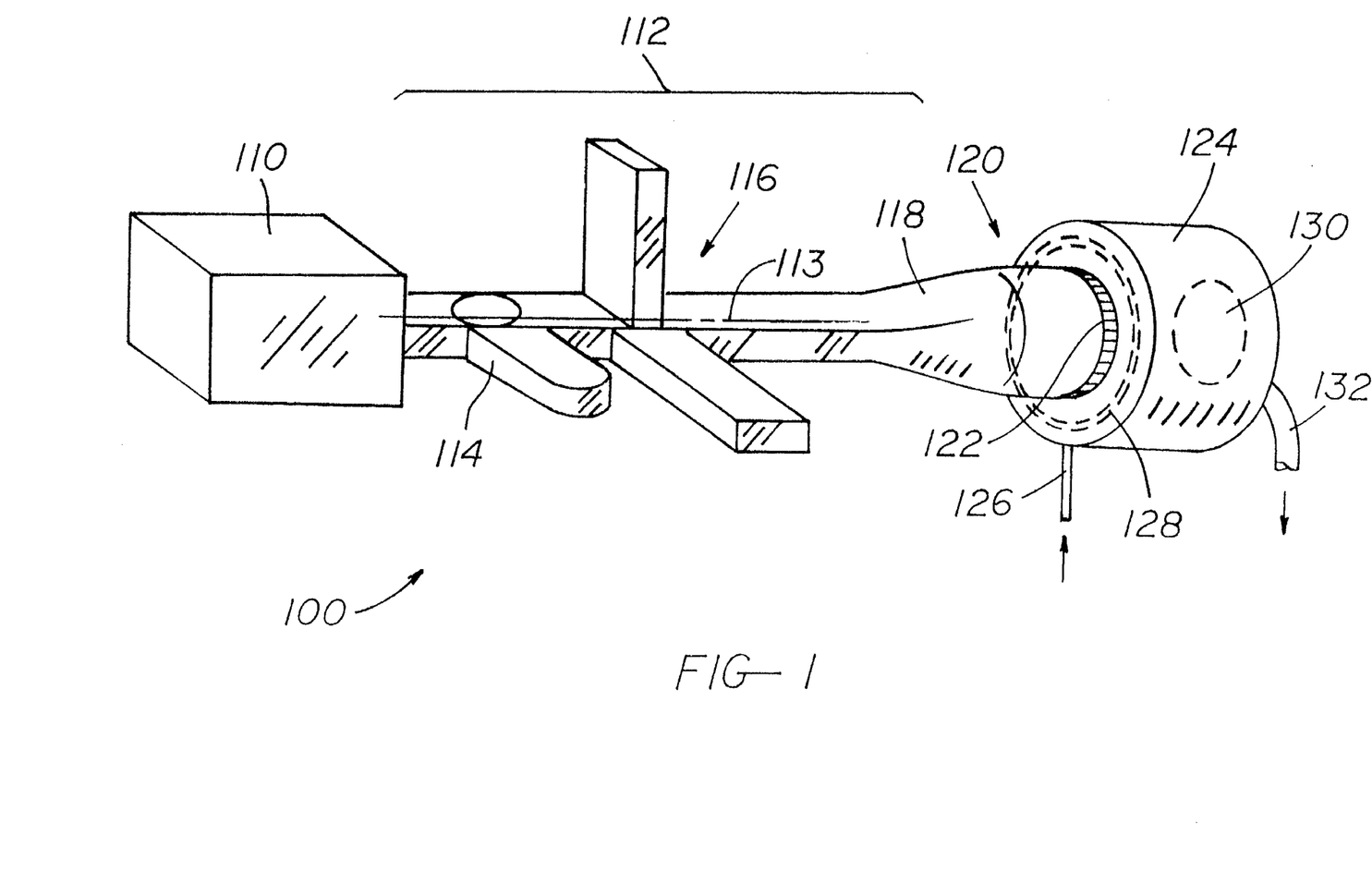
FIG. 1 is an oblique representation of a plasma processing system of the type which may benefit from the present invention.

The reader's attention is now directed to FIG. 1, which illustrates a plasma-processing system of the type which benefits from the methods and apparatus of the present invention. This overall system 100 includes a source of microwave energy 110, preferably a magnetron type of source, which feeds a waveguide-oriented microwave circuit 112 having a longitudinal axis 113. This longitudinal axis is generally assumed to run lengthwise down the center of the waveguide, and, in the event the waveguide branches or turns, this longitudinal axis is measured with respect to the output of the waveguide relative to a plasma-processing type of environment, as will be described below. Typically, this circuit includes a circulator 114 useful in absorbing microwave energy reflected back toward the source, a matching apparatus 116, useful in adjusting both electric and magnetic properties of the field carried by the waveguide, and a transition area 118 which adapts the smaller cross-sectional geometries associated with the waveguide 112 and components associated therewith to the larger cross-sectional dimensions associated with area 120, so as to distribute the energy across and through dielectric window 122 and into processing chamber 124. A reactive gas or gas mixture from a source (not shown in FIG. 1) flows through an inlet tube 126 and preferably enters chamber 124 through small apertures formed in annular ring 128 being in fluid connection with tube 126.

A target or substrate 130 is introduced into chamber 124 and is subjected to a plasma-related process by partially evacuating chamber 124 through pipe 132, introducing gases via line 126, and delivering microwave energy to chamber 124 by way of dielectric window 122. As the gas in line 126 emerges through apertures formed in annular ring 128, an ionized plasma is formed in the vicinity of ring 128 and on the chamber-side of window 122. By maintaining conditions conducive to the continued generation of this plasma, the ionized species may diffuse rightwardly in FIG. 1 in chamber 124 and impinge upon the surface of substrate 130, thereby bringing about the desired process, be it etching, deposition, or other surface modifying procedure.

This invention relates to apparatus and techniques which make it possible to develop a resonance surface, ideally a continuous resonance surface on the processing side of the dielectric window introduced in FIG. 1. At the same time, microwave energy generated by source 110 and delivered through the waveguide and transition elements described in FIG. 1 are more efficiently passed through the dielectric window and into the chamber wherein such plasma-related processes are carried out.

Broadly speaking, the present invention involves the placement of multiple permanently-magnetized elements generally within a plane parallel to the cross-section of an energy-carrying waveguide at the point where energy emerges from the waveguide. In most practical applications, the waveguide output will include a dielectric window to separate the waveguide from the plasma-processing area, in which case the magnetized elements may be disposed adjacent this window. The elements may be arranged in parallel rows or in concentric rings, and with the magnetization preferably oriented within the elements, a continuous resonance surface will be realized across the waveguide opening, which in turn may be used for plasma production in accordance with electron cyclotron resonance. Additionally, with the transverse electric field of the energy carried by the waveguide being oriented perpendicular to the central axis of the elements, the elements further serve to match waveguide to the output, thus facilitating the passage of energy through the elements with minimal reflection. Mode conversion may advantageously be used to properly orient the electric field of the energy with respect to the elements.

Figure 2A:
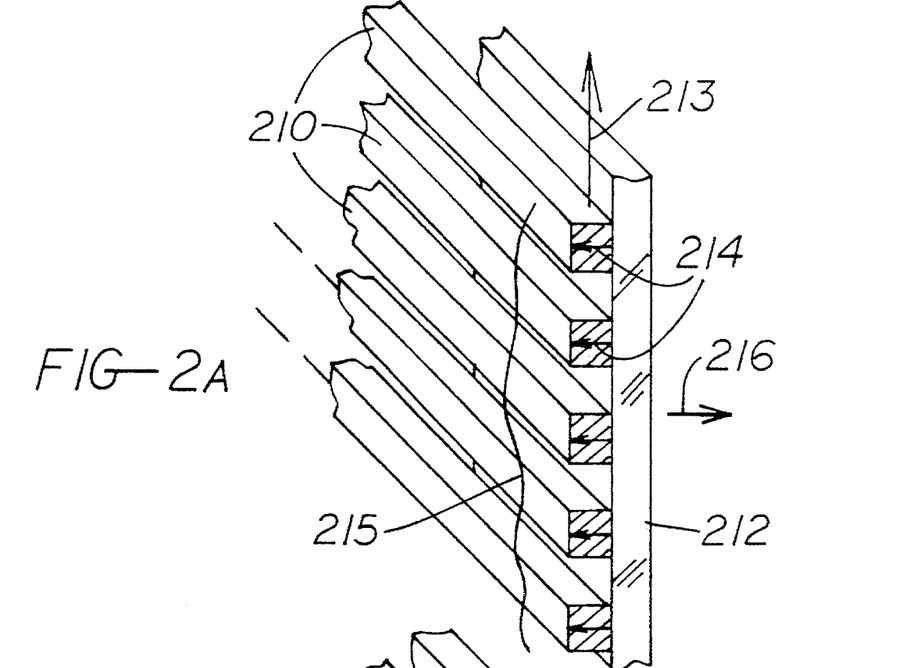
FIG. 2A is an oblique drawing of a plurality of magnetic bars disposed across a dielectric window, the magnetization within the bars being substantially perpendicular to the window, thereby reducing the magnetic field required by a supplemental solenoidally derived field.
Figure 2B:
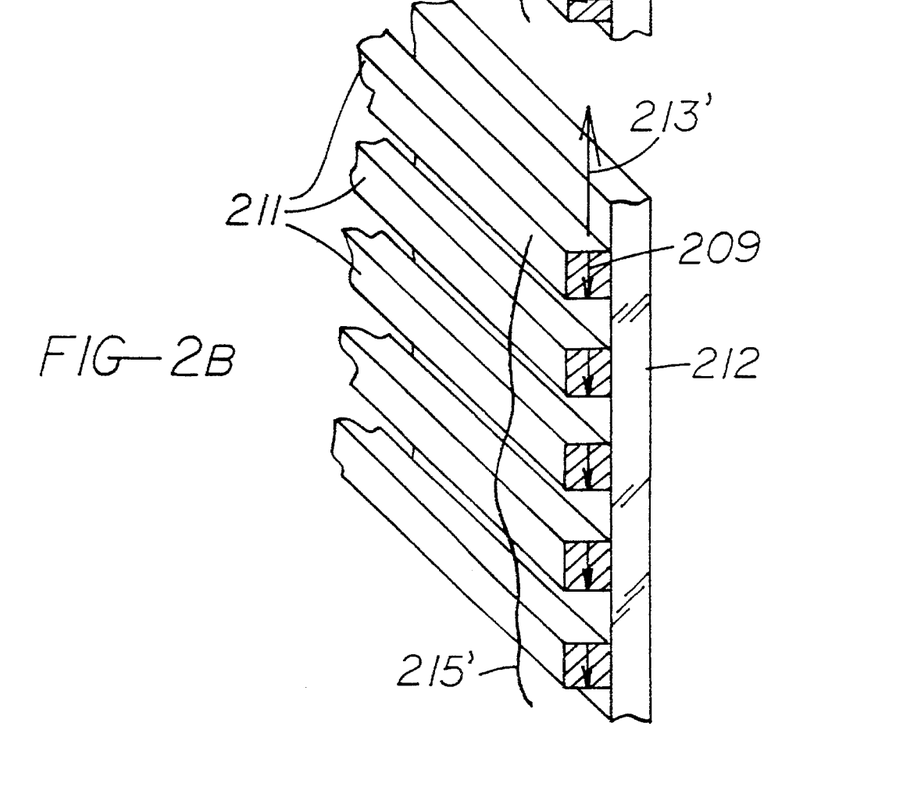
FIG. 2B is a drawing similar to that FIG. 2A, except that the magnetization of the bars is substantially parallel to the dielectric window, thus obviating the need for a solenoidal field altogether, this being the preferred orientation of the magnetic field.

Now making reference to FIG. 2A and 2B, the various embodiments associated with the advantages made possible by the present invention will become more evident. In FIG. 2A, for example, there is shown a plurality of bar-type magnets 210 presumed to be disposed proximate to the output of a waveguide (not shown). With the transverse component of the microwave electric field 213 oriented perpendicular to the magnetized elements 210 as shown in the figure, microwave energy readily passes through the spaces between the elements and the window 212. With the magnetization 214 oriented as shown, that is, perpendicular to central axis 209 of each element and perpendicular to the plane of the dielectric window, a continuous resonance surface 215 is formed, though an externally applied magnetic field, represented by vector 216, may still need to be supplied by a solenoidal source (not shown) in order to achieve a magnetic field sufficient to satisfy the ECR condition. Nevertheless, the applications of bars 210, even with field 214 being perpendicular to window 212, a marked reduction in the strength needed for field 216 is required for a useful ECR-generated plasma, thereby conserving power and reducing coil requirements.

A different magnetization orientation, however, further improves energy transfer, and results in a continuous surface 215' without the need for an externally supplied field, this preferred configuration being depicted in FIG. 2B. As shown, a plurality of magnetized bars or strips 211 are again arranged in parallel to one another. However, in this case, the direction of magnetization 209 within bars 211 is parallel to the waveguide output opening. Although in FIG. 2B this field is shown in a downward direction it may also be upwardly oriented and still produce a resonance surface while assisting in the transfer of microwave energy out of the waveguide. With the transverse electric field 213' of the energy carried by the waveguide remaining substantially perpendicular to the elements 211, it may again pass unimpeded into a processing environment.

Figures 2C, 3A:
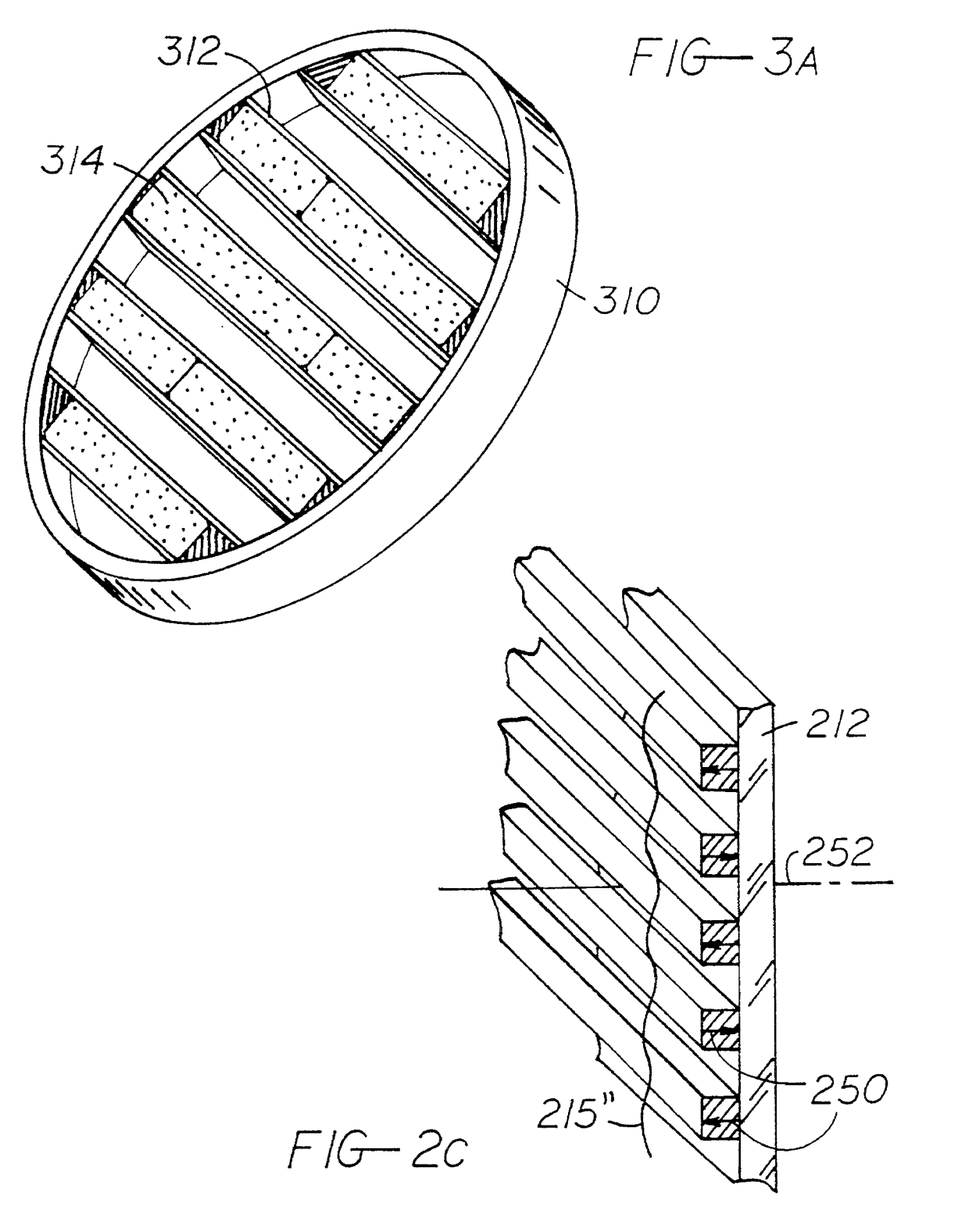
FIG. 2C is a drawing similar to that of FIG. 2B except that the magnetization of the bars is substantially perpendicular to the dielectric window, with the sense of the magnetization alternating from bar to bar, thus obviating the need for a solendoidal field altogether.
FIG. 3A is a drawing of a grill-like fixture which may be used to hold bar-type magnets against a dielectric window.

FIG. 2C depicts a third orientation of the magnetization of the elements which results in a continuous resonance surface 215" being produced for the ECR condition. In this embodiment, the sense of the magnetization 250 alternates from one row of elements to the next with the direction remaining parallel to the longitudinal axis 252 of the waveguide.

Figure 3B:
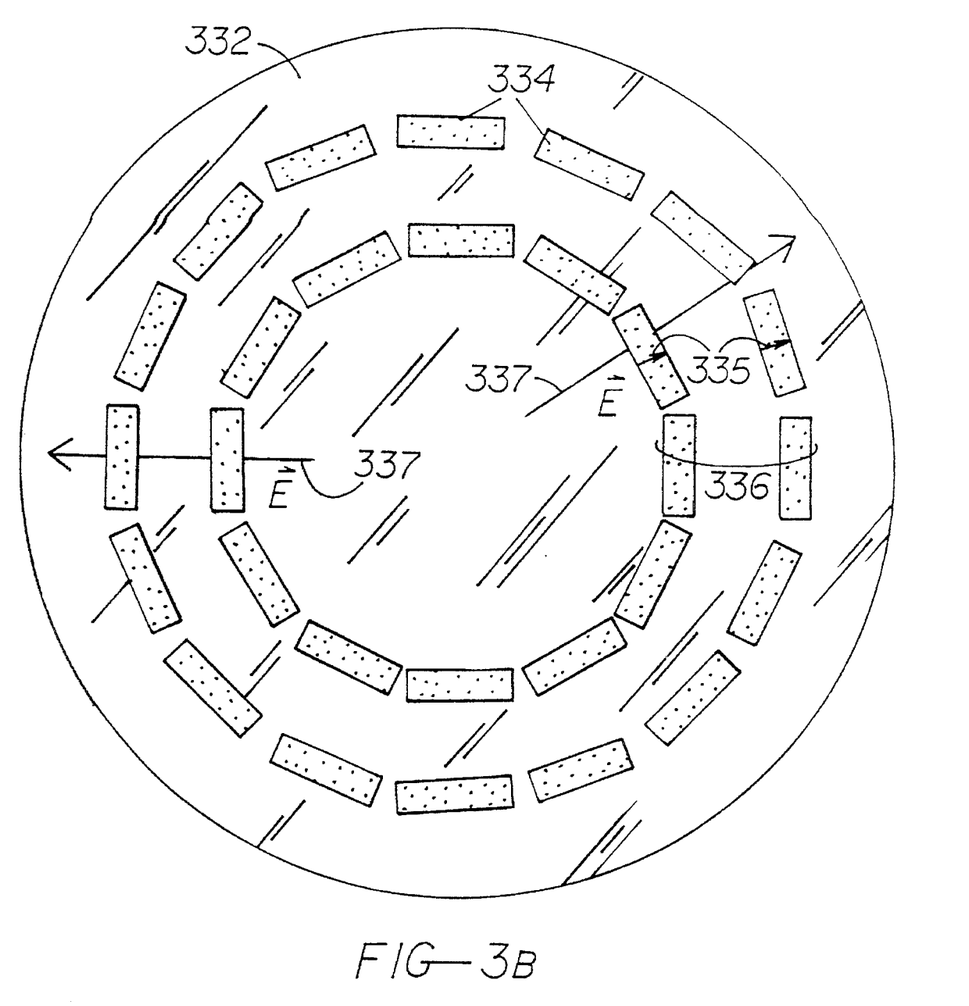
FIG. 3B is a drawing of an arrangement of elements in the form of concentric rings of magnetic material with magnetization of the rings substantially parallel to the dielectric window.

FIGS. 3A and 3B illustrate two magnetized element geometries, FIG. 3A representing the use of multiple straight elements arranged in a grill-like structure of parallel bars. FIG. 3A also shows a carrier 310 having a plurality of channels 312 within which magnets 314 may be inserted and held thereby. Carrier 310 is preferably formed of a non-magnetizable material, such as aluminum, though other non-magnetizable metallic materials and non-metals may advantageously be used for such a purpose. Portions of the frame may include cavities through which a coolant may be flowed, and such a frame may be configured for rectangular windows, as will be described below. The frame, or the elements themselves, may also serve to strengthen the window, thereby enabling thinner materal to be used, an important consideration in conjunction with reduced-pressure processing.

FIG. 3B illustrates how magnetized elements may be disposed in concentric circles in accordance with the present invention, an arrangement applicable, for example, to circular waveguide outputs capable of processing large-diameter round substrates in a batch mode. In this case elements 334, with magnetization oriented either radially inwardly or outwardly, as illustrated by vectors 335, are disposed against a round window 332. Although the drawing shows only two rings 336, additional rings may concentricly be added depending upon the desired final geometry. In FIG. 3B the rings are shown to be made of a juxtaposition of rectangular bar magnet elements. In another embodiment, the magnetized elements may be a continuous circular ring of magnetized material. With the energy carried by the waveguide operating in the $TM_{01}$ mode, the transverse electric field lines 337 will be substantially perpendicular to the central axis of each element, thereby minimizing reflection.

Figure 4A:
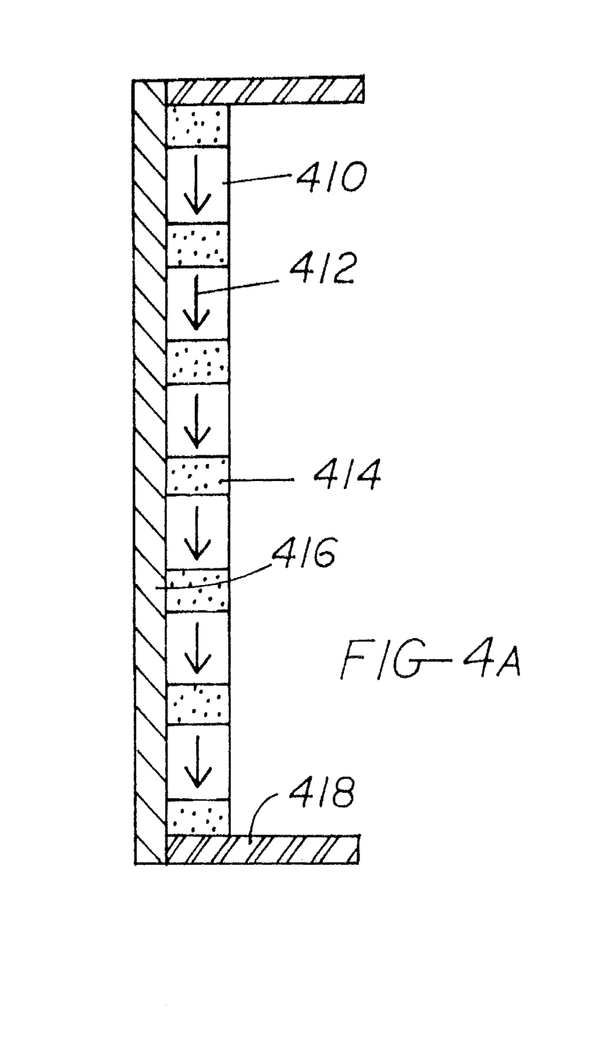
FIG. 4A is a cross-sectional drawing of a dielectric window having magnetic bars disposed thereagainst, but with the inclusion of ferrite material between the bars to strengthen the magnetic field, and with strips of magnetizable material being used to move the magnetic resonant surface relative to the plane of the dielectric window.
Figure 4B:
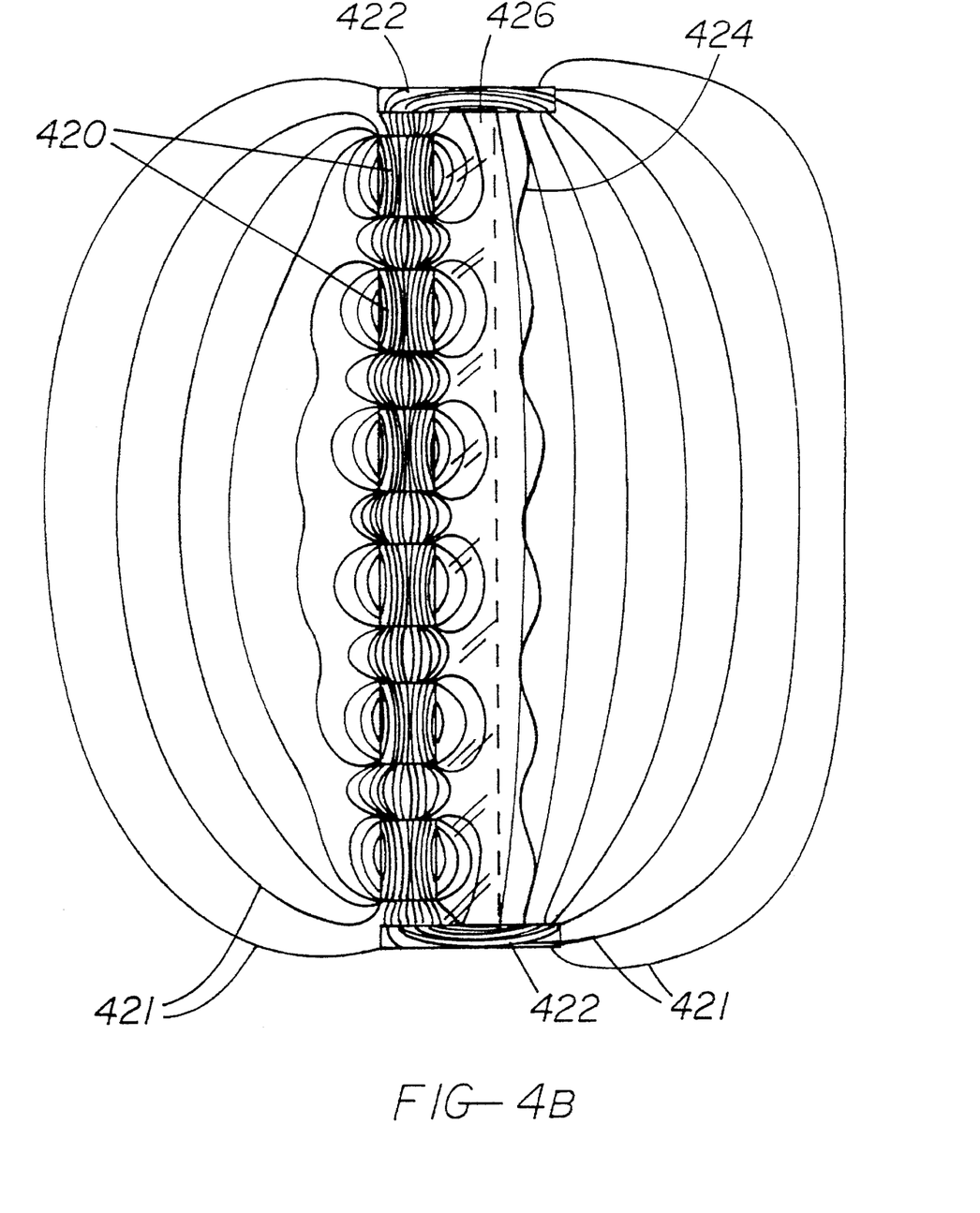
FIG. 4B is a drawing which shows how the magnetic lines of flux may be transferred away from a dielectric window through the use of the magnetizable strips of FIG. 4A, with or without the ferrite material.

FIGS. 4A and 4B relate to improvements upon the basic use of a plurality of parallel magnets disposed proximate to a dielectric window. In FIG. 4A, there is shown a cross-section of a dielectric window 416 against which a plurality of magnetized elements 410 have been placed, the magnetization within these bars being the preferred parallel orientation 412 relative to the plane of window 416. Two improvements to this basic structure are depicted in FIG. 4A, which may be applied independently or in conjunction with one another, with or without the window 416. The first of these improvements is the introduction of a ferrite material 414 between some or all of magnetic bars 410. As with a "keeper" placed across a horseshoe or similar type magnet, these ferrite inserts function to strengthen the field induced by magnets 410 across window 416 thus maximizing the field strength in the region to the right of the window as shown in FIG. 4A.

The second improvement depicted in FIG. 4A is the use of a strip of magnetizable material 418, preferably disposed about a portion of the periphery of window 416 and the structure just described. This strip, which is preferably composed of a ferrous-type of material such as steel, acts to move the resonant surface developed by bars 410, with or without ferrite inserts 414, rightwardly away from the surface of window 416 in FIG. 4A. This action is highly advantageous in that without strips 418, the resonant surface generated by bars 410 must remain substantially close to the magnetized bars or strips, and, as such, typically mandates that the bars or strips be disposed on the evacuated side of the dielectric window. This results in maintenance problems, and may also subject the materials undergoing processes internal to the chamber to unwanted contamination from the magnets or contaminants trapped within their supporting structure.

However, with the strips of magnetizable material just described, the resonance surface may be effectively displaced away from the plane wherein the magnets are disposed, and, in the event that the resonant surface may be located sufficiently distant from the magnets, they may be placed on the non-evacuated side of the window, thereby eliminating the maintenance and contamination problems just described. This situation is depicted in FIG. 4B, wherein the fields generated by magnetized elements 420 combine to form the field depicted by lines 421. With strips 422 added as shown, resonance surface 424 may be moved away from window 426 and into the evacuated or processing side of the window 426.

The present invention is applicable to all waveguide geometries, including circular and rectangular. In the rectangular geometry the strips 422 of FIGS. 4B could lie along the top and bottom edges of the waveguide. In the circular geometry, the two strips would be shaped semicircularly so as to lie closely to the window edge at points 180 degrees apart.

In the, case of a circular waveguide output, however, mode conversion may be necessary in order to ensure that the transverse electric field components of the electromagnetic energy carried by the waveguide are polarized perpendicular to the central axis of the elements. With modes properly adjusted, there will be little, if any, reflectance by the elements, and the energy will pass uninhibited through the openings in the waveguide. In this sense, then, the elements, being in the form of a grill-like structure, act as a circuit element as seen by the energy within the waveguide, and, with proper adjustment, this circuit element may essentially contribute to reducing the reflection of electromagnetic energy away from the grid-like structure.

In the case of a circular waveguide, which may be operating predominantly in the $TE_{11}$ mode, a mode converter may be used to convert a percentage of the energy into the $TM_{11}$ mode, so that the total power is carried by a ratio of these two modes. The combination of the $TE_{11}$ and $TM_{11}$ modes in the waveguide results in a composite electric field being substantially perpendicular to the longitudinal axis of the waveguide and to the central axis of the parallel elements, as shown in FIGS. 2A and 2B. By controlling the fraction of $TE_{11}$-mode power being converted to the $TM_{11}$ mode, the shape of the electric field lines may be adjusted such that most of the power passes between the elements with very little reflection because the electric field is polarized perpendicular to the elements. Essentially, the superimposition of the $TE_{11}$ and $TM_{11}$ modes produces a composite electric field which is a close approximation to the $HE_{11}$ hybrid mode electric field which again sees the elements as a lossless circuit through which the energy may pass with little, if any, reflection. In the case of circular waveguide with circular rings of elements as shown in FIG. 3B, the preferred mode would be the $TM_{01}$ mode whose transverse electric field component is radial and perpendicular to the central axis of the elements, thereby being reflected only slightly by the magnetized rings.

In the case of a rectangular waveguide opening, various configurations of magnetized elements may advantageously be used to create a resonant surface to excite a plasma, depending upon the aspect ratio of the waveguide. For example, in FIG. 5A, there is shown a waveguide depicted by broken lines 516 having an aspect ratio comprising a horizontal dimension A and a vertical dimension B, wherein the A dimension is larger than the B dimension. In such a case, with the waveguide operating primarily in the $TE_{10}$ mode, two or more rows of magnetized elements 510 having magnetization field vectors represented by arrows 512 may be disposed in accordance with the drawing, further using strips 514 comprised of a magnetizable or ferrous material such as cold-rolled steel. For a typical waveguide, and with magnets having a cross-section of approximately one inch on the side, the configuration in FIG. 5A will readily pass energy from a waveguide and into an environment wherein a plasma process may be carried out.

Figure 5A:
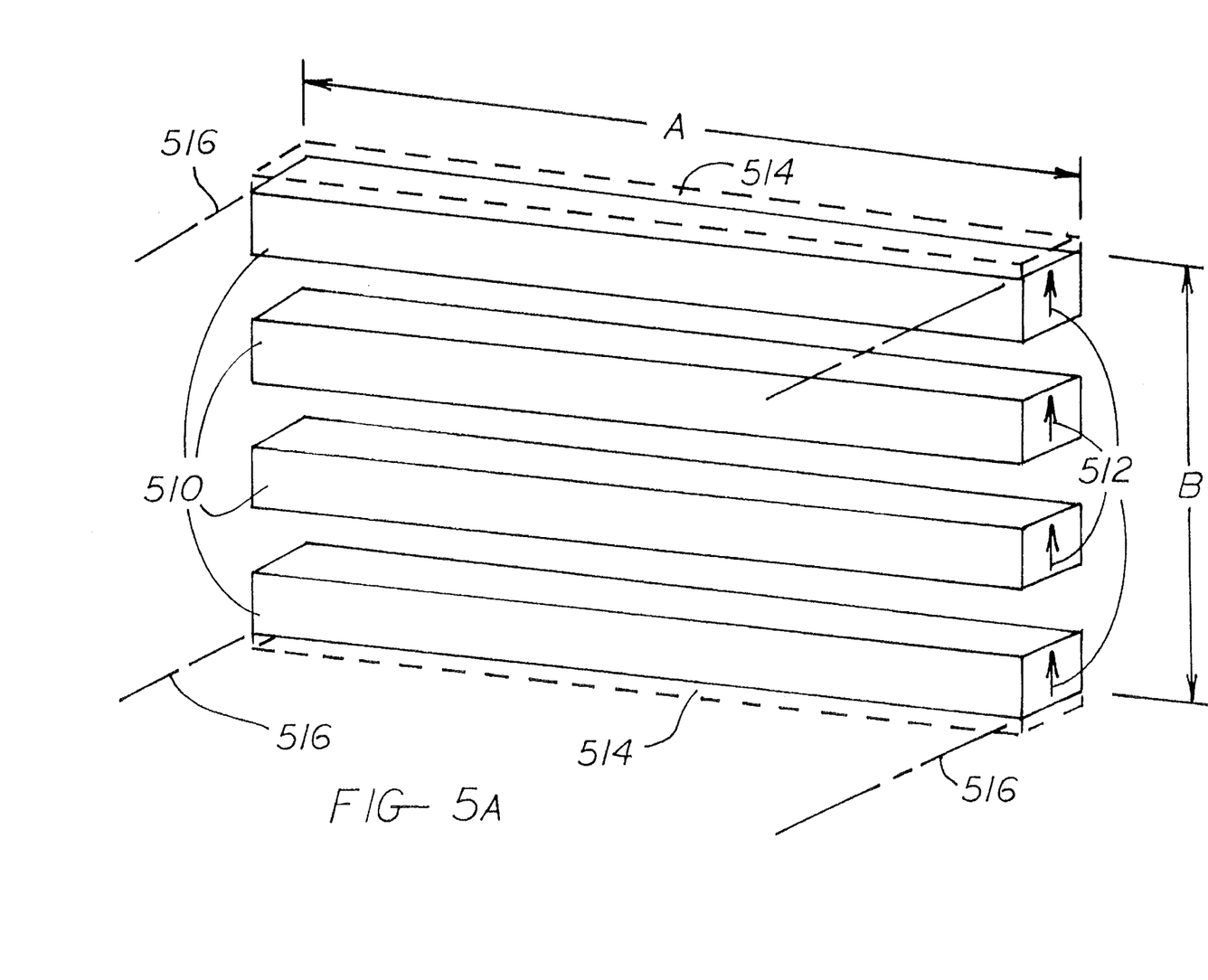
FIG. 5A is an oblique drawing of a rectangular waveguide output opening having a width greater than its height with bar-shaped magnets used to form a resonance surface with the waveguide operating in the $TE_{10}$ mode.

To accommodate larger waveguide openings, the basic structure depicted in FIG. 5A may be joined side-by-side with other such structures so as to create a larger circuit-of elements. For example, additional structures may be placed side-by-side, resulting in an overall assembly having a horizontal dimension of 2A and a height of B or, alternatively, they may be stacked vertically, resulting in a surface having a height of 2B and a width of A. Further alternative assemblies are possible, enabling energy to pass through very large multiple waveguide openings, resulting in resonance surfaces having dimensions of many inches on a side.

Figure 5B:
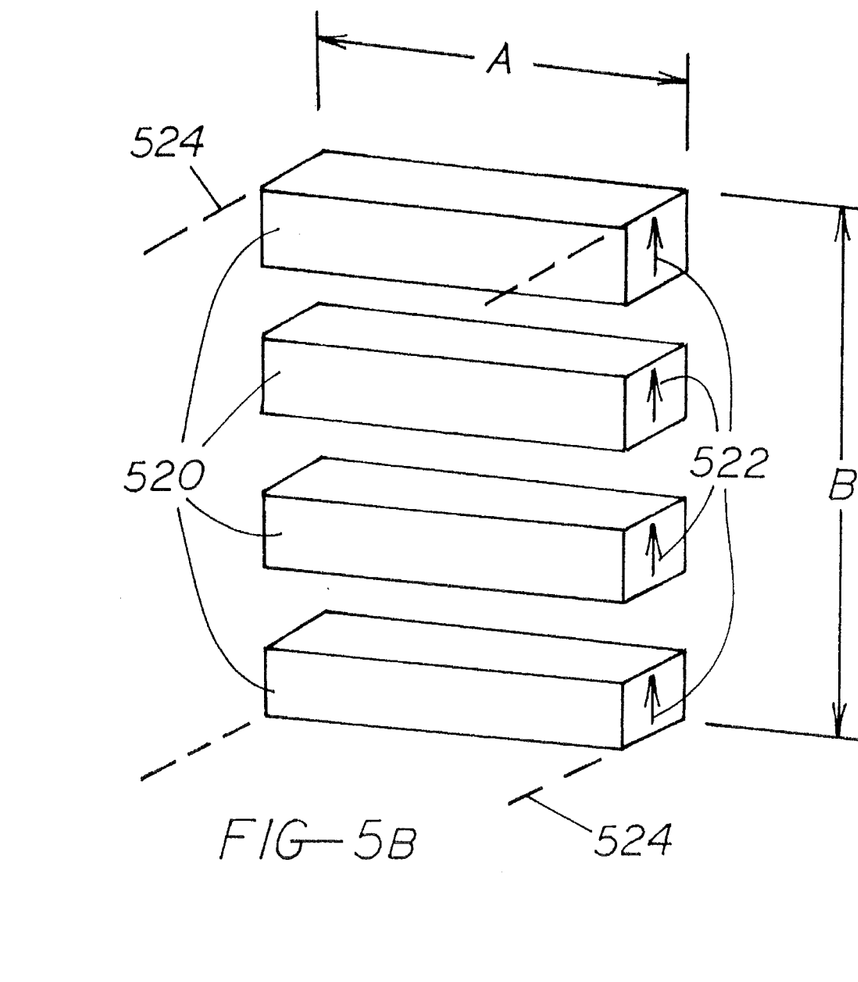
FIG. 5B is an oblique drawing of a rectangular waveguide output opening having a width less than its height with bar-shaped magnets used to form a resonance surface with the waveguide operating in the $TE_{01}$ mode.

Another basic structure which may advantageously be used in conjunction with a rectangular waveguide opening is depicted in FIG. 5B. Here, the waveguide, depicted by broken lines 524, forms a basic unit having a height of B and a width of A, the height being greater than the width. In such a case, with the energy carried by the waveguide being predominantly in the TE$_{01}$ mode, multiple elements 520 having magnetization vectors 522 may be disposed transverse to the waveguide as shown in the figure. Although the magnetization vectors are shown in an upward orientation in both FIGS. 5A and 5B, it should be understood that, in the preferred embodiment, the magnetization vectors may also be oriented downwardly. Also in FIG. 5B, as in FIG. 5A, the basic structure shown may be replicated with additional such structures, either widthwise or heightwise in order to generate larger resonant surfaces and subsequent plasmas over greater areas.

Figure 6A:
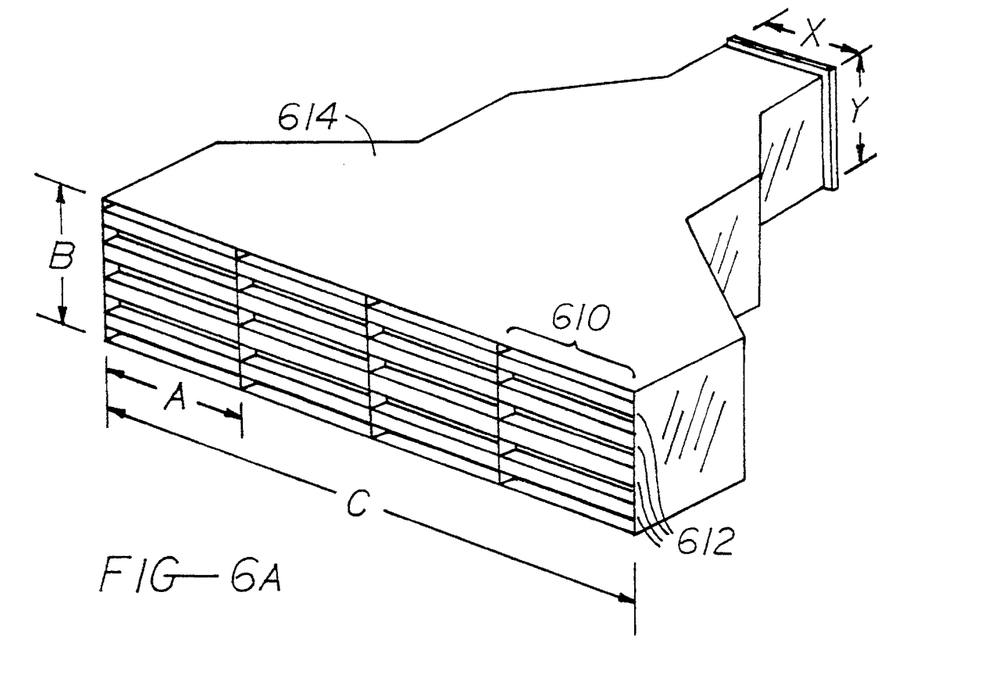
FIG. 6A is an oblique drawing of a horn-shaped rectangular waveguide using a power divider to accommodate a larger grill of magnetized elements for larger substrates.

Now turning to FIG. 6A, there is depicted one construction which may be used to generate very large resonant surfaces, suitable for performing plasma-related processes upon even larger substrates. Energy enters the smaller opening of the waveguide shown in the upper righthand portion of the oblique drawing, this entrance having a width dimension of X and a height dimension of Y. This waveguide entrance then transitions into a one-to-four power divider 614, which results in an overall waveguide opening having a height B and a width C equal to four times A. Thus, at the output of the waveguide, there are four modules 610, each having a height dimension of B and a width dimension of A, the energy being evenly distributed to these four modules by virtue of the power divider.

In each of the four modules 610 shown in FIG. 6A, there are disposed four rows of magnetized elements 612. Depending upon the aspect ratio of A to B, these four elements may be geometrically in compliance with the basic structures depicted in FIGS. 5A and 5B. With the assembly shown, making use of four rows of magnetized elements, it may be assumed that each module 610 contains one of the structures shown in FIG. 5A, with or without the steel strips, for a total of four such pieces across the overall exit of the waveguide. Thus, for example, with an A dimension of 4.5 inches and a B dimension of 3.75 inches, the output of the waveguide will have a total area of 3.75 inches by 18 inches.

Figure 6B:
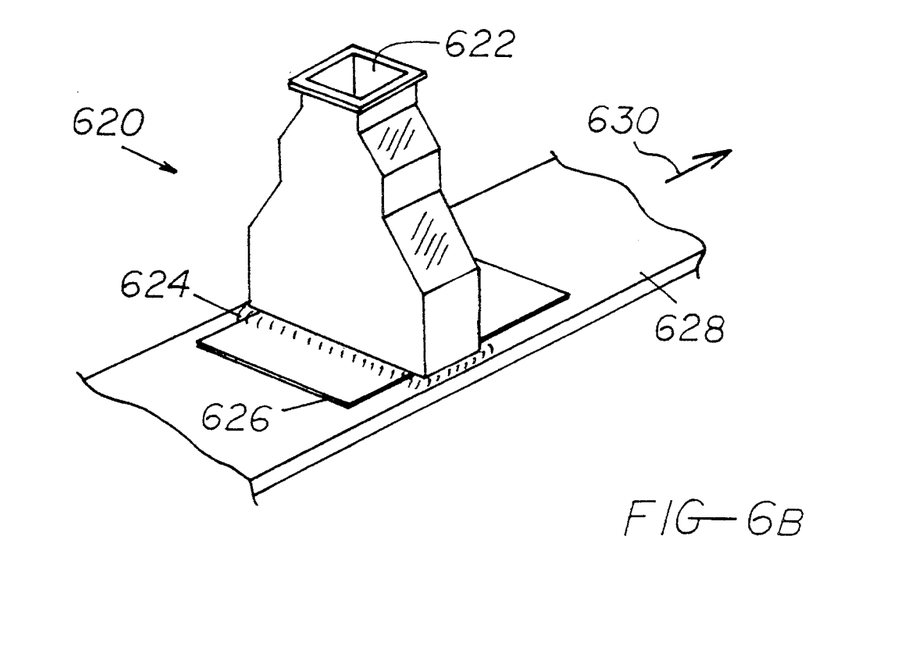
FIG. 6B is an oblique drawing which shows how the horn-shaped waveguide of FIG. 6A may be used as part of an in-line production process for very large substrates, such as those associated with flat-panel displays and photovoltaic sheets.

Now referencing FIG. 6B, there is shown a technique by which the waveguide of FIG. 6A may be used as part of an in-line process capable of performing a plasma-related process over the surface of a very large substrate, be it circular, rectangular or of a different shape. These applications include deposition, sputtering, etching, surface preparation and any other plasma-related processes in industries including, but not limited to, electronics and materials processing. For example, the process which will now be described with reference to FIG. 6B may advantageously be used in conjunction with substrates associated with display devices such as liquid-crystal and other types of flat-panel displays.

As shown in FIG. 6B, the waveguide, being somewhat horn-shaped due to the incorporation of the power divider, is suspended above and perpendicular to a substrate 626 as shown in the figure. A plasma is formed in the area of 624 in a space between the output of the waveguide and the upper surface of the substrate. This space may or may not be evacuated to create a reduced pressure, depending upon the process performed. The opening of the waveguide and substrate 626 are then moved relative to one another, with the preferred technique being to move a support or belt 628 upon which substrate 626 rests relative to the waveguide as shown by arrow 630. In operation, as energy enters opening 622 in waveguide 620 and as plasma 624 is produced proximate to the surface of substrate 626, the entire surface of the substrate will be exposed to the plasma as platform belt 628 is moved in the direction of 630 relative to waveguide 620. In this way, substrates much larger than the opening of the waveguide may be treated as part of an in-line production process.

Figure 6C:
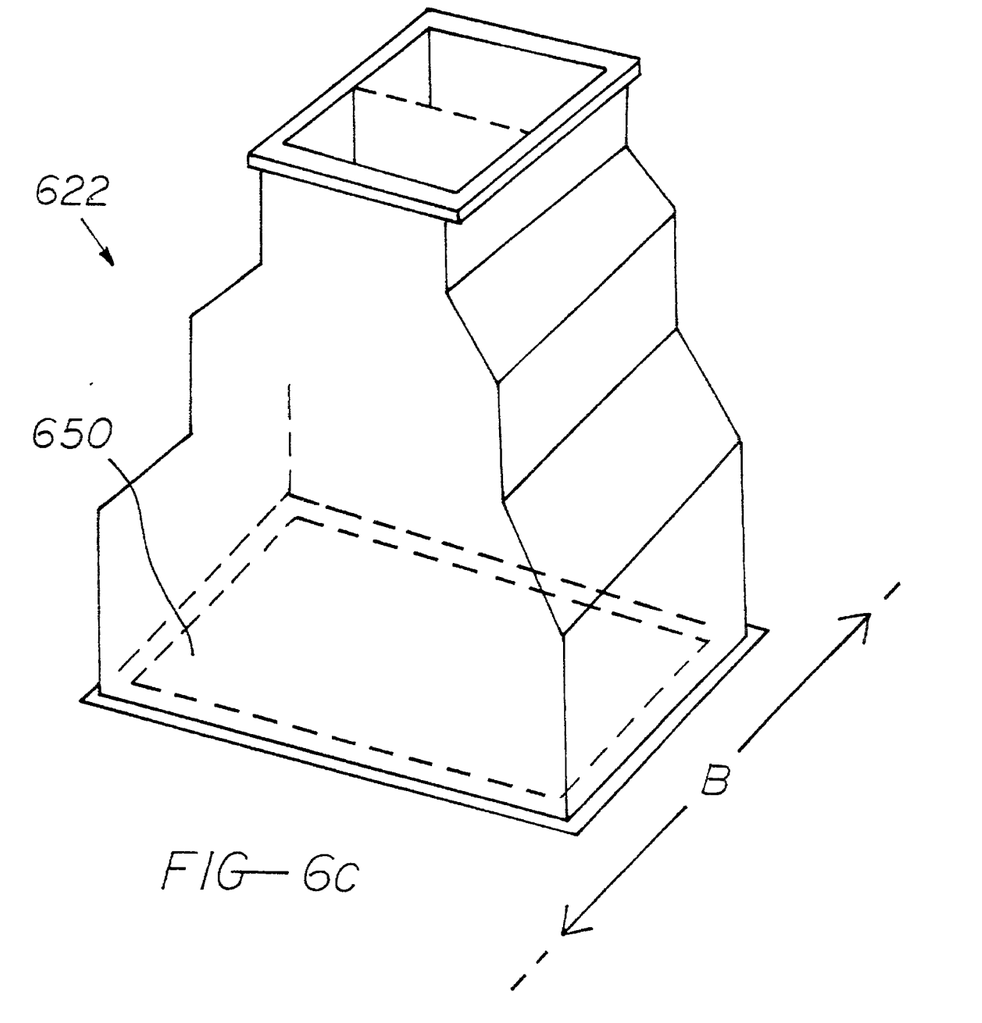
FIG. 6C is an oblique drawing with shows how multiple horn-shaped waveguides may be ganged to accommodate even larger substrates, suitable for batch processing wherein the waveguide and substrate are in fixed positions.

As a further alternative, that being depicted in FIG. 6C, two or more waveguides of the type show in FIG. 6A may be arranged to increase the area covered in the "B" direction, thereby facilitating batch-mode processing of a large substrate 650, wherein both the substrate and the waveguide 652 remaining stationary during such processing.

Having thus described my invention, I claim:

1. A device useful in forming a resonance surface proximate to a waveguide output for the purpose of plasma generation, comprising:

a plurality of magnetized elements disposed in spaced-apart relation across the output of the waveguide in a plane parallel to the cross-section of the waveguide at the output, each element having a length and a central axis, the elements being magnetized in such a manner that their fields combine to form a substantially continuous resonance surface characterized in having a magnetic induction value sufficient to support ECR plasma generation.

2. The device of claim 1 wherein the magnetization of the elements is oriented perpendicular to the central axis of each element and parallel to the cross-section of the waveguide at the output.

3. The device of claim 2 wherein the elements are straight and arranged in parallel, spaced-apart relation to one another.

4. The device of claim 2 wherein the elements are arranged across the waveguide output in the form of concentric, spaced-apart circular rings.

5. The device of claim 1 wherein the elements are disposed adjacent a dielectric window used to separate the waveguide from a plasma-processing area.

6. The device of claim 5 further including at least one strip of magnetizable material forming a magnetic circuit associated with at least part of the periphery of the window, the strip functioning to displace the resonance surface away from the plane of the elements, thereby allowing the elements to be disposed on the waveguide-side of the window with the resonance surface being formed on the opposite side of the window.

7. The device of claim 1 wherein the elements are used in conjunction with an externally supplied solenoidal magnetic field directed along the longitudinal axis of the waveguide, the magnetization within each element being oriented perpendicular to the central axis of the elements and parallel to the longitudinal axis of the waveguide output, the direction of the magnetization being in opposed relation to the externally supplied solenoidal magnetic field, thereby reducing the magnitude of the solenoidal field required to form the resonance surface sufficient to support the plasma generation.

8. The device of claim 3 wherein the elements are magnetized in a direction perpendicular to the central axes of the elements and parallel to the longitudinal axis of the waveguide, the sense of the magnetization vector within each element vector alternating from row to row of the elements.

9. The device of claim 1 wherein the transverse component of the electric field of the energy carried by the waveguide is oriented perpendicular to the central axis of each element, enabling the energy to pass through the spaces between the elements with minimal reflection.

10. The device of claim 9 wherein the output of the waveguide is circular in cross section, and wherein mode conversion is used to adjust the relative amplitudes of the $TE_{11}$ and $TM_{11}$ modes in order to orient the transverse electric field perpendicular to the central axis of each element.

11. The device of claim 9 wherein the elements are straight and arranged in parallel, spaced-apart relation to one another across the output of the waveguide, the output being rectangular in cross section, the width of the output being parallel to the central axis of the elements, the height of the output being perpendicular to the elements.

12. The device of claim 11 wherein the width of the waveguide is greater than the height, the waveguide operating predominantly in the $TE_{10}$ mode.

13. The device of claim 11 wherein the width of the waveguide is less than the height, the waveguide operating predominantly in the $TE_{01}$ mode.

14. The device of claim 9 wherein a plurality of rectangular waveguide modules, each including a plurality of parallel elements, are placed side by side to form a larger overall waveguide output capable of processing more surface area of a substrate at a given time.

15. The device of claim 14 wherein the substrate is associated with a flat-panel display device.

16. The device of claim 9, wherein the size of the elements and spacing between the elements is selected to minimize reflection at the plane of the elements.

17. A device for coupling microwave energy from the output of a waveguide through a continuous resonance surface formed to generate an ECR plasma, comprising:

a plurality of spaced-apart, bar-type magnetic elements disposed lengthwise across the output of the waveguide, the elements being parallel to one another and to the cross section of the waveguide, the orientation of the magnetization of each element being substantially similar, the field contributed by each element combining to form a substantially continuous resonance surface transverse to the longitudinal axis of the waveguide, the magnetic flux density B at each point over the surface being of sufficient magnitude to support plasma generation in accordance with electron cyclotron resonance where:

$$\frac{2\pi mf}{e}$$

where m and e are the mass and charge of the electron, respectively, and f is the frequency of the energy carried by the waveguide.

18. The device of claim 17 wherein a bar-type magnetic element is made up of a plurality of shorter bar magnets placed end to end.

19. The device of claim 17 wherein the frequency carried by the waveguide is approximately 2.45 GHz, the waveguide being of sufficient cross-sectional area to transmit energy of this frequency.

20. The device of claim 17 wherein the frequency carried by the waveguide is approximately 915 MHz, the waveguide being of sufficient cross-sectional area to transmit energy of this frequency.

21. The device of claim 17 wherein the frequency carried by the waveguide is approximately 400 MHz, the waveguide being of sufficient cross-sectional area to transmit energy of this frequency.

22. The device of claim 17 wherein the elements are disposed adjacent a dielectric window installed at the output of the waveguide.

23. The device of claim 22, wherein the elements are hollow, and a coolant flows through the hollow elements to cool the window.

24. The device of claim 22, wherein a rigid frame is used to hold the elements in place adjacent the window.

25. The device of claim 24, wherein portions of the frame include channels through which a coolant may be flowed such that the window is cooled.

26. The device of claim 17 further including ferrite material disposed in the spaces between the bars, thus forming a partial magnetic circuit comprising the bars, the ferrite material, and the surrounding region of non-magnetic material.

27. The device of claim 17 wherein a rigid frame is used to hold the element bars in place.

28. The device of claim 27 wherein portions of the frame include channels through which a coolant may be flowed.

29. A device for coupling microwave energy from the output of a waveguide through a continuous resonance surface formed to generate an ECR plasma, comprising:

a plurality of spaced-apart concentric rings of magnetized material disposed across the output of the waveguide, the rings lying in a plane parallel to the cross section of the waveguide at its output, the orientation of the magnetization of each ring being parallel to the cross section of the waveguide and aligned radially outwardly with respect to the central longitudinal axis of the waveguide, the field contributed by each ring combining to form a substantially continuous resonance surface transverse to the longitudinal axis of the waveguide, the magnetic flux density B at each point over the surface being of sufficient magnitude to support plasma generation in accordance with electron cyclotron resonance where:

$$\frac{2\pi mf}{e}$$

where m and e are the mass and charge of the electron, respectively, and f is the frequency of the energy carried by the waveguide.

30. The device of claim 29, wherein the direction of the magnetization is radially inward.

31. The device of claim 29, wherein the direction of magnetization is radially outward.

32. The device of claim 29 wherein the waveguide is circular in cross-section, the waveguide operating predominantly in the $TM_{01}$ mode.

33. The device of claim 29 wherein each ring is made up of a plurality of shorter bar magnets placed end to end so as to approximate a circular ring.

* * * * *